United States Patent [19]
Dyck et al.

[11] Patent Number: 4,876,586
[45] Date of Patent: Oct. 24, 1989

[54] GROOVED SCHOTTKY BARRIER PHOTODIODE FOR INFRARED SENSING

[75] Inventors: Rudolph H. Dyck, Palo Alto; Jae S. Kim, Cupertino, both of Calif.

[73] Assignee: Sangamo-Weston, Incorporated, Norcross, Ga.

[21] Appl. No.: 135,816

[22] Filed: Dec. 21, 1987

[51] Int. Cl.$^4$ ............................................. H01L 27/14
[52] U.S. Cl. ........................................ 357/30; 357/15; 357/55; 357/60; 357/67; 357/32
[58] Field of Search ................... 357/15, 55, 60, 30 C, 357/30 H, 30 L, 30 Q, 30 R, 30 D, 67 S, 71 S, 31, 32

[56] References Cited
U.S. PATENT DOCUMENTS

| | | |
|---|---|---|
| 3,585,714 | 6/1971 | Li. |
| 4,037,311 | 7/1977 | Blackman et al. |
| 4,079,507 | 3/1978 | King. |
| 4,135,290 | 1/1979 | Evans, Jr. |
| 4,234,887 | 11/1980 | Vanderslice, Jr. |
| 4,276,099 | 6/1981 | Keen et al. |
| 4,364,164 | 12/1982 | Bluzer et al. |
| 4,371,406 | 2/1983 | Li. |
| 4,488,163 | 12/1984 | Bluze et al. |
| 4,528,260 | 7/1985 | Kane. |
| 4,565,756 | 1/1986 | Needs et al. |
| 4,604,161 | 8/1986 | Araghi. |
| 4,703,337 | 10/1987 | Yamazaki ............... 357/30 R |

FOREIGN PATENT DOCUMENTS

| | | | |
|---|---|---|---|
| 53-121494 | 10/1978 | Japan | ............. 357/30 L |
| 57-199274 | 12/1982 | Japan | ............. 357/30 L |
| 2164492 | 3/1986 | United Kingdom | ............. 357/30 L |

OTHER PUBLICATIONS

Kosonocky et al., "160×244 Element Pts: Schottky-Barrier IR-CCB Image Sensor," *IEEE Special Issue of Transactions*, E,B, 1985, pp. 1–29.

McKee, "Enhanced Quantum Efficiency of Pd$_2$Si Schottky Infrared Diodes on 111Si," *IEEE Transactions on Electron Devices* (Jul. 1984) ED-31(7), 968–970.

Bassovs et al., "Fabrication of Dense Arrays of Nozzles and Channels with High Degree of Precision," *IBM Technical Disclosure Bulletin*, vol. 19, No. 6, Nov. 76, 2243–46.

Wolf, "Photovoltaics II: Flat Panels," *IEEE Spectrum*, Feb. 1980, pp. 32–33.

*Primary Examiner*—William A. Mintel
*Attorney, Agent, or Firm*—Townsend and Townsend

[57] ABSTRACT

A sensor optimized for detecting infrared radiation is formed by a Schottky barrier photodiode having a corrugated upper surface upon which a thin layer of metal silicide is deposited. The corrugated surface is formed by selective etching of a (100) silicon wafer to expose the (111) crystalline plane.

15 Claims, 4 Drawing Sheets

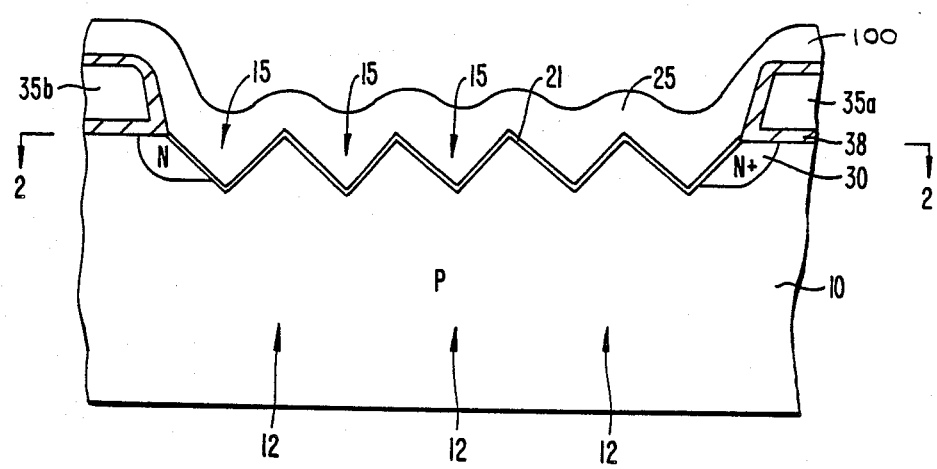
FIG._1.
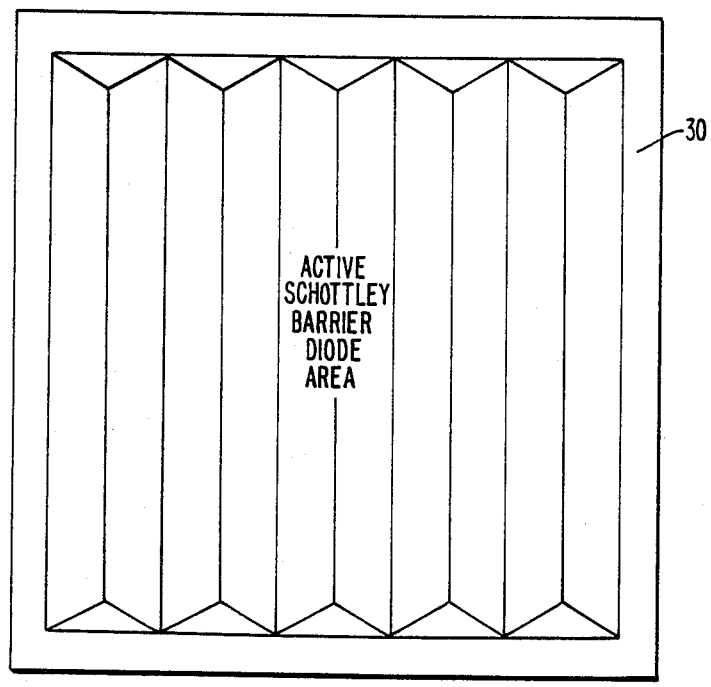
FIG._2.

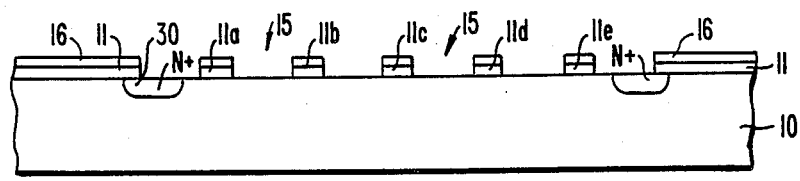
FIG._3.
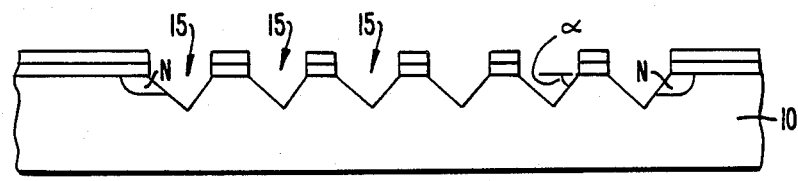
FIG._4.
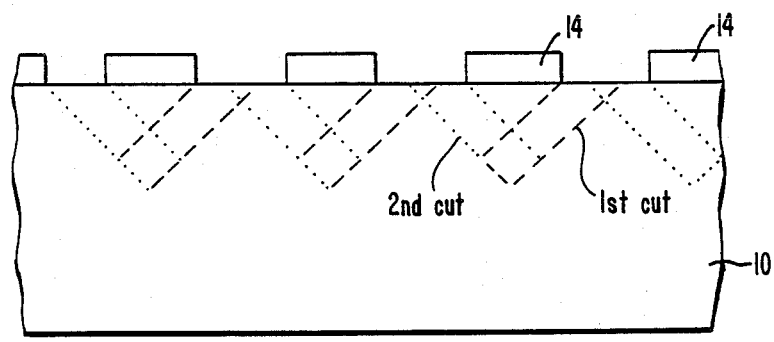
FIG._5.

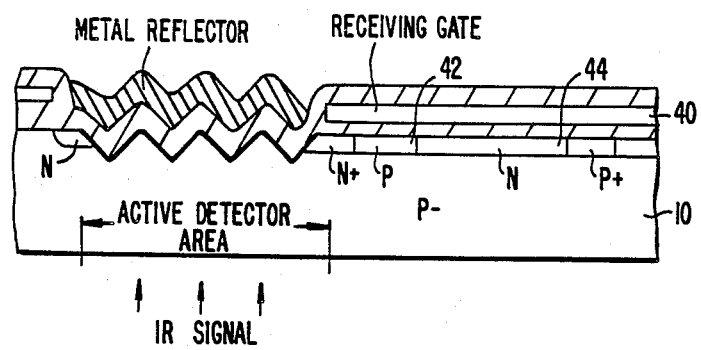
FIG._6.
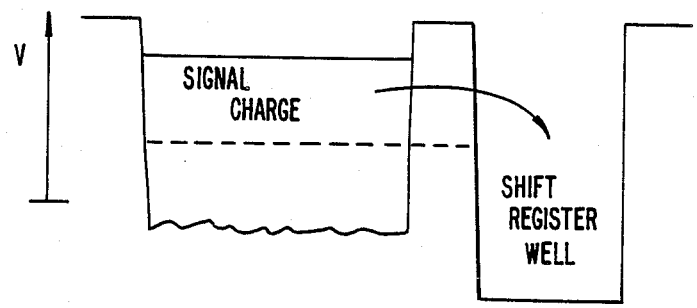
FIG._7.
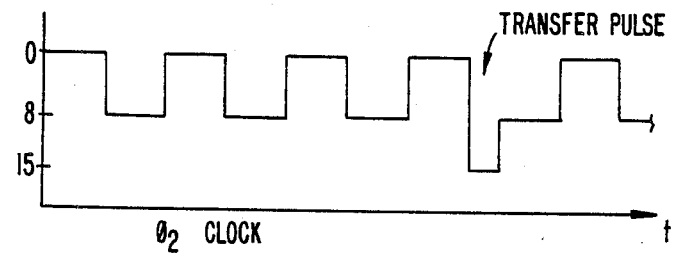
FIG._9.

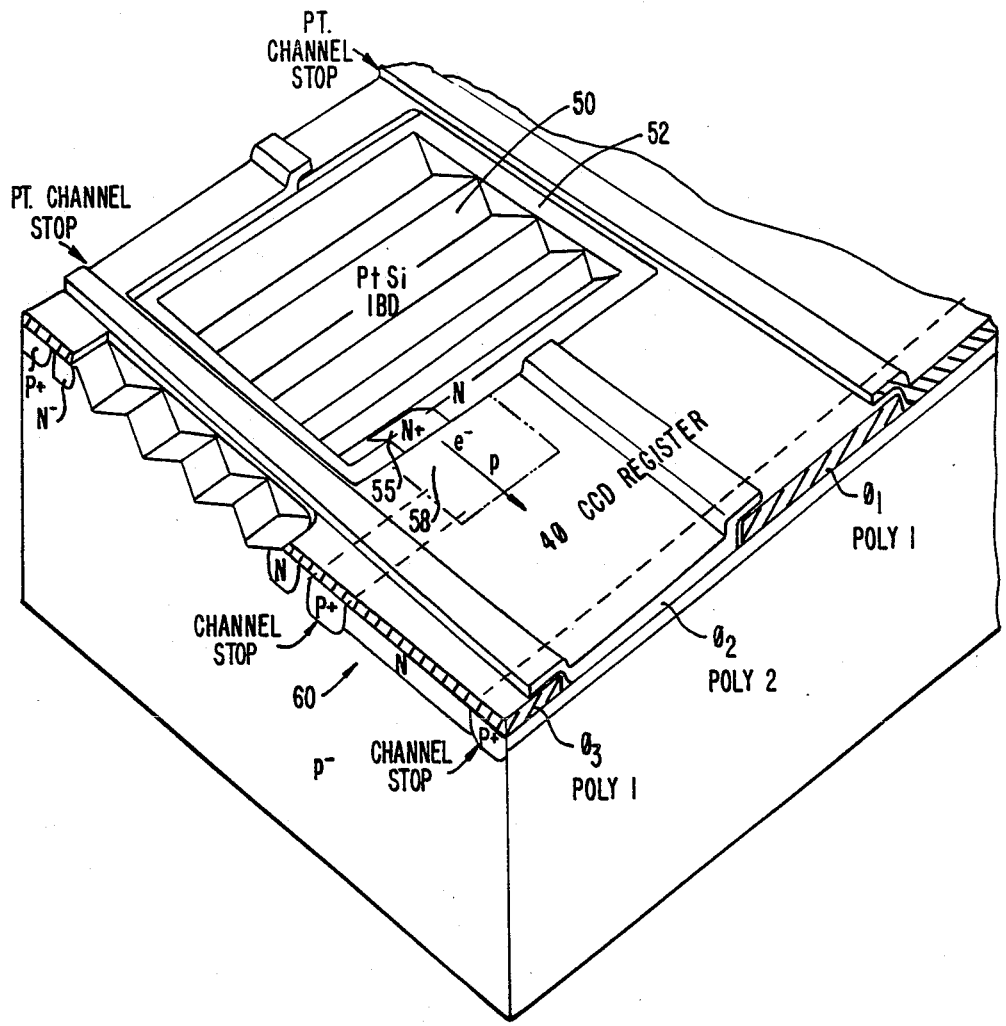
FIG._8.

GROOVED SCHOTTKY BARRIER PHOTODIODE FOR INFRARED SENSING

BACKGROUND OF THE INVENTION

1. Field of the Invention

This invention relates to apparatus for sensing infrared or other electromagnetic radiation, and in particular, to a Schottky barrier photodiode having a grooved upper surface to increase detection efficiency.

2. Description of the Prior Art

Applications for remote sensing have expanded enormously over the past 20 years. Such technology has wide application for the detection, measurement, and analysis of natural and man-made objects remotely situated from the observer. The detection of infrared radiation is one aspect of remote sensing particularly useful for night vision and satellite imaging.

To detect infrared radiation, several types of devices have been developed. These include intrinsic semiconductors such as mercury-cadmium-tellurium, extrinsic semiconductors such as gallium- or indium-doped silicon, and Schottky barrier photodiodes such as palladium silicide on silicon. While each of these devices finds particular application, the use of Schottky barrier photodiodes has been limited because of their low quantum efficiency.

A typical prior art Schottky barrier photodiode infrared detector is a planar device. Usually, the device includes a layer of metal silicide on the upper surface of a silicon body. The silicide is overlaid by insulating material and a mirror. Infrared radiation directed onto the lower surface of the silicon body passes through the silicon, through the metal silicide, reflects off the mirror, and returns through the metal silicide. As the light passes through the silicide, it causes holes or electrons (depending upon the conductivity type of the substrate) to be injected into the substrate for collection and detection using conventional charge-coupled device technology or MOS readout technology. One such Schottky barrier photodiode is shown in the article by R. C. McKee, "Enhanced Quantum Efficiency of Pd$_2$Si Schottky Infrared Diodes on <111> Si," *IEEE Transactions on Electron Devices* (July 1984) ED-31(7), p. 968. Unfortunately, such prior art devices have very low quantum efficiencies; for example, the quantum efficiency of platinum silicide is usually under 2% in the desired 3 to 5 micron wavelength range, and under 1% at 4 microns.

SUMMARY OF THE INVENTION

We have discovered a technique for significantly increasing the quantum efficiency of Schottky barrier photodiode sensors. According to a preferred embodiment of our technique, the responsivity of a Schottky barrier photodiode is increased substantially by forming grooves in the surface plane of the photodiode during fabrication of the device. By forming the grooves with appropriate angular orientations, infrared radiation will pass through the active metallic layer more than the one or two times possible with the planar structures. In addition to the maximization of the optical path, there is the possibility with some material systems that the sensitivity of the device is enhanced by the different crystal orientation of the exposed silicon surfaces.

In a preferred embodiment of our invention, an electromagnetic radiation-sensitive semiconductor structure includes a semiconductor substrate having a surface in which a first region is electrically separated from surrounding portions of the substrate by a guard ring. In the first region a plurality of corrugations extend into the substrate from the surface, and a layer of radiation-sensitive metal silicide is formed on the surface of the corrugations overlapping the guard ring.

BRIEF DESCRIPTION OF THE DRAWINGS

FIG. 1 is a cross-sectional view of a photodiode fabricated according to a preferred embodiment of our invention;

FIG. 2 is a top view of the structure shown in FIG. 1;

FIG. 3 illustrates a starting point for the fabrication of grooves in the structure in FIG. 1;

FIG. 4 illustrates a later step in the process of fabricating grooves;

FIG. 5 illustrates an alternative technique for forming grooves;

FIG. 6 is a cross-sectional view of an overall cell within the photodiode;

FIG. 7 illustrates the channel potentials created by the structure of FIG. 6;

FIG. 8 is a perspective view illustrating the overall structure of a portion of the infrared sensing array; and FIG. 9 is a timing diagram showing one phase of the clock signals used in FIG. 8.

DETAILED DESCRIPTION OF THE PREFERRED EMBODIMENTS

FIG. 1 is a cross-sectional view of a grooved Schottky barrier photodiode structure fabricated according to a preferred embodiment of the invention. The structure shown in FIG. 1 forms a single Schottky barrier photodiode, and on a typical integrated image sensor circuit thousands of such structures will be formed, typically in a linear or rectangular array. For example, some arrays have over 100,000 photodiodes. By focusing infrared radiation 12 onto the structure using a lens, or other means, so as to form an image, collecting the photo-excited charge, then scanning the array to detect the accumulated charge, an image detection device is created.

The structure of a single photodiode includes a series of grooves 15 formed in the upper surface of the silicon. A thin layer of radiation-sensitive material, preferably a metal silicide 21, is disposed on the upper surface of the corrugations 15. A layer of silicon dioxide 100, or other insulating material across the upper surface of the structure separates the silicide 21 from a layer of aluminum (not shown). The Schottky barrier photodiode portion of the structure generally requires a guard ring 30 which is typically an N-type region in the P-type substrate. The guard ring, which minimizes dark current, extends annularly around the diode structure, as shown in FIG. 2. Silicide 21 is ohmically connected by ohmic connection 38 to the N conductivity type guard ring 30. In general, in an image sensor array each photodiode is surrounded by control gates 35a and 35b, one of which controls the readout of the photogenerated charge.

In operation of the sensor, infrared light 12 enters at the lower surface of the wafer 10. The radiation passes through the silicon essentially unattenuated and into the metal silicide layer. There, the radiation excites holes and electrons within the silicide layer such that some of them, depending on the conductivity type of the substrate, are injected into the substrate 10. After the desired exposure time, the residual charges in the silicide layer are transferred out by appropriate clock signals applied to the control electrode 35a at the diode. In this manner, an output signal is provided which is related to the intensity of the infrared radiation 12. Thousands of such cells, each reading the intensity of the radiation striking a pixel, allow the creation of an image representative of the scene from which the infrared radiation was originally emitted.

The fabrication of the structure of FIGS. 1 and 2 is described in conjunction with FIGS. 3–5. FIG. 3 is a cross-sectional view of a structure from which the structure of FIG. 1 may be manufactured. The structure shown in FIG. 3 includes a (100) monocrystalline silicon substrate 10 over which a layer of silicon dioxide 11 is formed. A layer of photoresist 16 is deposited over the silicon dioxide. (In previous well known semiconductor fabrication steps, the surrounding polysilicon gate structure and the N conductivity-type guard ring 30 are formed.) Using conventional photolithographic techniques, oxide layer 11 is patterned into a series of ridges 11a, 11b, 11c, & 11e and openings 15 to the wafer 10 where grooves are desired. In a preferred embodiment these openings are about 3 microns wide on approximately a 4-micron pitch. The openings are aligned very closely to the <110> substrate crystal orientation.

Next, the upper surface of the structure is subjected to a preferential etch using any well known selective etchant, for example, potassium hydroxide. Grooves 15 are formed by the preferential etch as a result of the very slow etch rate on the (111) crystal faces. FIG. 4 depicts the structure near completion of the etching step, exposing the (111) crystalline planes positioned at an angle α which is 54.7° below the horizontal. When the etching process is allowed to continue beyond the instant depicted in FIG. 4, silicon 10 will be removed from beneath the protective oxide 11, resulting in grooves like those depicted in FIG. 1, that is, with peaked or nearly peaked ridges between the grooves. The grooves typically will be about 2 microns deep.

After formation of the grooves, a layer of metal silicide 21 is formed on the exposed surfaces, as shown in FIG. 1. Such a layer may be deposited as metal silicide itself, for example, by chemical vapor deposition. Alternatively, a thin layer of the selected metal may be sputtered or otherwise disposed on the grooves and then the structure heated to react the metal with the underlying silicon to form metal silicide. A variety of metals may be employed. In the preferred embodiment, platinum silicide is formed or deposited; however, palladium or iridium silicides also may be employed, depending on the particular infrared spectral response desired. Preferably, the silicide layer is very thin, typically on the order of less than 40 Angstroms. The thinness of the layer allows a larger percentage of the excited holes to escape from the layer into the silicon 10 leaving electrons in the silicide layer to be detected.

A protective layer of silicon dioxide or other dielectric then may be deposited across the surface. If desired, an aluminum layer may be sputtered or otherwise formed over the oxide to reflect any radiation passing completely through the silicide.

FIG. 5 illustrates an alternative technique for fabricating the grooved structure. Using this technique, regions of photoresist 14, or other etch resistant material such as silicon dioxide or silicon nitride, are formed on the upper surface of monocrystalline silicon 10 with relatively small gaps between them. Then using ion beam milling, channels are milled in the silicon substrate by orienting the beam at a desired angle, usually one near 45° with respect to the upper surface of the substrate. The first cut will produce a series of trenches sloping into the substrate at an angle equivalent to the angle of the ion beam. Then a second cut is employed at a corresponding opposite angle to form the other walls of the grooves. If necessary, additional chemical or mechanical processes may be employed to finish the ends of the grooves, smooth the surface of the grooves, or otherwise alter their shape after the ion milling. The ion milling allows the angle α to be adjusted to expose other than the (111) crystalline face which results from the selective etching process of FIGS. 3 and 4.

FIG. 6 is a cross-sectional view of a larger portion of an infrared detector employing the grooved structure of this invention. Except for the metal reflector, the left-hand portion of the figure has been described in conjunction with FIG. 1. The metal reflector is an optional feature which may be added to the structure to reflect any electromagnetic radiation not reflected at the silicide/insulator interface. In this manner the radiation which otherwise might escape is redirected through the metal silicide.

The right-hand portion of the figure includes a receiving gate 40, typically of polycrystalline silicon, which is connected to receive a clock signal. In the well known manner of charge-coupled devices, the clock signal raises and lowers the surface potential of the substrate 10 beneath gate 40, in P region 42. Simultaneously, the electron potential of the well in N-type region is raised and lowered. When lowered, signal charge accumulating in the silicide and its N+ contact as a result of the exposure to the infrared signal is permitted to flow to N type region 44 below the receiving gate 40. Once this transfer is complete, these electron potentials may be raised to allow new signal charge to accumulate in response to the infrared radiation in the next integration period. After the charge has been transferred to the shift register well created by doped region 44 and gate 40, it may be clocked out of the sensing array for detection, amplification, or other use.

FIG. 8 is a perspective view of one cell in an infrared sensor fabricated according to this invention. The cell includes a Schottky barrier photodiode 50 with grooved upper surface. The photodiode includes an N conductivity type guard ring 52 which includes a more strongly doped region 55. Strongly doped P type channel stops surround the guard ring except in the region 58, where the channel stop is interrupted. It is through this region that charge is transferred from the photodiode to the shift register 60. Once the charge has been transferred into the shift register, it may be clocked out using any well known CCD clocking scheme. FIG. 8 depicts a four-phase register.

FIG. 9 is a timing diagram illustrating the clock signal of the phase used to control charge transfer into the shift register. Transfer pulses are inserted into the normal shift register pulse train periodically to lower the barrier electron potential sufficiently to transfer charge from the photodiode into the register. After transfer, charge accumulates in the photodiode until the next transfer pulse.

The foregoing has been a description of a preferred embodiment of the invention. Although specific thicknesses, geometrical arrangements, and the like have been described, it should be understood that the invention is not limited in these regards, and that these details have been provided to enable a more complete understanding of the invention. The scope of the invention is set forth in the appended claims.

We claim:

1. A plurality of electromagnetic radiation sensitive semiconductor structures on a substrate having a first surface region, each of said structures comprising:
   a plurality of corrugations extending into the substrate from the first surface region, said corrugations having corrugation surfaces with a crystal orientation of <111>; and
   an electrically conductive radiation sensitive coating disposed over the plurality of corrugations, said radiation sensitive layer exciting carriers upon exposure to radiation such that at least a portion of said carriers are injected into said substrate.

2. A structure as in claim 1 wherein the coating comprises a metal silicide.

3. A structure as in claim 2 wherein the metal silicide comprises platinum silicide.

4. A structure as in claim 2 wherein the metal silicide comprises iridium silicide.

5. A structure as in claim 2 wherein the silicide comprises palladium silicide.

6. A structure as in claim 3 wherein the semiconductor substrate comprises monocrystalline silicon.

7. A structure as in claim 6 wherein the first surface of the semiconductor substrate is of the (100) crystallographic orientation.

8. A structure as in claim 1 further comprising a dielectric layer disposed over the coating.

9. A structure as in claim 8 further comprising a mirror disposed over the dielectric layer.

10. A sructure as in claim 9 wherein the mirror comprises aluminum and the substrate comprises P conductivity type.

11. A structure as in claim 1 further comprising a guard ring of a conductivity type opposite said substrate disposed in the substrate to surround the plurality of corrugations.

12. A structure as in claim 1 wherein the electromagnetic radiation comprises infrared radiation.

13. An infrared sensitive Schottky barrier photodiode structure comprising:
    a (100) monocrystalline silicon substrate having an upper surface and an active Schottky barrier photodiode region at the upper surface;
    a plurality of corrugation extending downward from the surface of the substrate in the active Schottky barrier photodiode region, each corrugation exposing a (111) crystal face of the substrate;
    a layer of platinum silicide disposed over the surface of the corrugations; and
    a dielectric layer disposed over the platinum silicide.

14. The structure as recited in claim 2, wherein the metal silicide comprises a metal selected from the group platinum silicide, iridium silicide, palladium silicide, and mixtures thereof.

15. A plurality of electromagnetic radiation sensitive semiconductor structures on a substrate having a first surface region, each of said structures comprising:
    a plurality of corrugations extending into the substrate from the first surface region, said corrugations having corrugation surfaces oriented near 45° with respect to said surface; and
    an electrically conductive radiation sensitive coating disposed over the plurality of corrugations, said radiation sensitive layer exciting holes or electrons upon exposure to radiation such that at least a portion of said holes or electrons are injected into said substrate.

* * * * *